United States Patent [19]
Baumann et al.

[11] Patent Number: 6,051,366
[45] Date of Patent: *Apr. 18, 2000

[54] VISIBLE RADIATION SENSITIVE COMPOSITION AND RECORDING MATERIAL PRODUCIBLE THEREFROM

[75] Inventors: Harald Baumann, Dessau; Hans-Joachim Timpe; Hans-Peter Herting, both of Osterode, all of Germany

[73] Assignee: Kodak Polychrome Graphics LLC, Norwalk, Conn.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/450,968

[22] Filed: May 25, 1995

[30] Foreign Application Priority Data

May 27, 1994 [DE] Germany ............................ 44 18 645

[51] Int. Cl.[7] ................................................ G03F 7/029
[52] U.S. Cl. .................................. 430/281.1; 430/270.1; 430/284.1; 430/920; 430/919; 430/926; 430/947; 430/914; 522/15; 522/25
[58] Field of Search ................................. 430/281, 270, 430/284, 920, 919, 926, 947, 914, 281.1, 284.1; 522/15, 25

[56] References Cited

U.S. PATENT DOCUMENTS

| | | | |
|---|---|---|---|
| 4,069,054 | 1/1978 | Smith | 430/919 X |
| 4,175,963 | 11/1979 | Crivello | 430/281 X |
| 4,548,891 | 10/1985 | Riediker et al. | 430/283.1 |
| 4,590,287 | 5/1986 | Riediker et al. | 556/53 |
| 4,713,401 | 12/1987 | Riediker et al. | 522/65 |
| 4,857,654 | 8/1989 | Riediker et al. | 556/53 |
| 4,921,827 | 5/1990 | Ali et al. | 502/167 |
| 4,960,746 | 10/1990 | Hüsler et al. | 430/281 |
| 4,963,470 | 10/1990 | Klingert et al. | 430/281.1 |
| 4,971,892 | 11/1990 | Ali et al. | 430/281 |
| 5,011,755 | 4/1991 | Rohde et al. | 430/281 X |
| 5,049,479 | 9/1991 | Zertani et al. | 430/271 |
| 5,049,481 | 9/1991 | Okamoto et al. | 430/283.1 |
| 5,086,086 | 2/1992 | Brown-Wensley et al. | 522/25 |
| 5,106,722 | 4/1992 | Husler et al. | 430/325 |
| 5,147,900 | 9/1992 | Palazzotto et al. | 430/281 X |
| 5,229,253 | 7/1993 | Zertani et al. | 430/284 X |
| 5,378,579 | 1/1995 | Arimatsu et al. | 430/281.1 |
| 5,629,354 | 5/1997 | West et al. | 522/25 |

FOREIGN PATENT DOCUMENTS

| | | | |
|---|---|---|---|
| 2038284 | 3/1991 | Canada | G03F 7/27 |
| 2041191 | 10/1991 | Canada . | |
| 2097038 | 11/1993 | Canada . | |

OTHER PUBLICATIONS

D.B. Yang et al, "Inorganic and Organometallic Photoinitiators" in *Radiation Curing:Science and Technology*, S.P. Pappas, Ed, Plenum, NY, NY 1992, pp. 21–55.

The Sigma–Aldrich Handbook of Stains, Dyes and Indicators, F.J. Green, Aldrich Chemical Co., Milwaukee, Wisconsin, 1990, Victoria Blue (lines missing on pages and no page numbers given or found.

Photochemistry of Dyed and Pigmented Polymers, N.S. Allen & J.F. McKeller, eds, Applied Science Publishers, London, 1980, p. 210–213.

Farbstoff [Dyes], Schweizer, 1964, pp. 247–251 and 258–260. (In German–English translation of "relevant passage" given.

B.M. Monroe, in Radiation Curing: Science and Technology, S.P. Pappas, ed., Plenum Press, New York, 1992, p. 420.

S.P. Pappas, Ed., Plenum, New York, 1992, pp. 21–55.

J. Finter, et al., Makromol. Chem. Macromol. Symp. 24, 177–187 (1989).

D.F. Eaton, Photo. Sci & Eng., 23(3), 150–154 (1979).

B.M. Monroe and G.C. Weed, Chem Rev., 93, 435–448 (1993).

*Primary Examiner*—Cynthia Hamilton
*Attorney, Agent, or Firm*—Ratner & Prestia

[57] ABSTRACT

A visible radiation sensitive composition is described which comprises a binder, one or more polymerizable compounds containing at least one polymerizable group, and one or more dyes having an absorption range in the emission range of the radiation source, characterized in that said composition comprises as an initiator an initiator system consisting of a metallocene as a photoinitiator and an onium compound as a coinitiator. The visible radiation sensitive composition shows an increased radiation sensitivity compared to the known radiation sensitive compositions and is especially suitable for recording materials such as printing plates, which can, in particular, also be exposed by means of laser radiation in the visible range.

10 Claims, No Drawings

VISIBLE RADIATION SENSITIVE COMPOSITION AND RECORDING MATERIAL PRODUCIBLE THEREFROM

FIELD OF THE INVENTION

The invention relates to a visible radiation sensitive composition with a novel initiator system comprising a metallocene compound as a photoinitiator and an onium compound as a coinitiator. The visible radiation sensitive compositions according to the present invention are especially made use of for printing plates and in the field of photoresist technology.

BACKGROUND OF THE INVENTION

Visible radiation sensitive compositions have been used for years in photopolymerizable compositions for the production of visible radiation sensitive materials, such as for example printing plates. In particular for novel techniques (i.e. exposure by means of lasers) an improved sensitivity is required, in particular within the visible range of the spectrum, in order to shorten the duration of the exposure. From an economical point of view, it is also important that low-intensity lasers can be used which are less expensive and more reliable than high-intensity lasers. Therefore, attempts have been made for quite some time to increase the sensitivity of visible radiation sensitive compositions which are to be used in photopolymerizable compositions.

It is known that the radical polymerization of ethylenically unsaturated compounds can be initiated by radiation with visible light in the presence of photoreducible dyes and reduction agents, such as for example amines (U.S. Pat. No. 3,097,096). EP-A-122 223 discloses photoinitiators and photopolymerizable compositions which contain metallocenes. By means of such metallocenes it was possible to increase the sensitivity of the photopolymerizable layer and to thus reduce the necessary duration of exposure and the required power of the radiation source. Efforts were also made to obtain improved results by using further modified metallocenes, for example in EP-A-401 165, U.S. Pat. No. 4,590,287, EP-A-255 486, EP-A-256 981 and U.S. Pat. No. 5,106,722.

DE-A-40 08 815 describes a photopolymerizable composition comprising a polymerical binder, a radically polymerizable compound with at least one polymerizable group and at least one photooxidizable group in the molecule as well as a metallocene as a photoinitiator.

In order to obtain a further increase in sensitivity, an attempt was made to use the metallocene together with a coinitiator. EP-B-269 573 for example discloses liquid mixtures of photoinitiators using solutions of titanocene compounds in liquid photoinitiators of the α-hydroxy and α-aminoacetophenone derivative type. DE-A-38 32 032 describes a photopolymerizable mixture comprising a polymeric binder, a radically polymerizable compound with at least one polymerizable group, a photoreducible dye and a metallocene as an initiator as well as a coinitiator. The coinitiator is a trihalogenemethyl compound cleavable by radiation, which is to be used for increasing the visible radiation sensitivity. Those compounds having a triazine ring in the basic structure which carries two trihalogenemethyl groups are preferred.

DE-A-40 13 358 describes a special process for the production of printing plates or photoresists wherein metallocenes are used as photoinitiators, which is aimed at the improvement of photosensitivity.

U.S. Pat. No. 3,717,558 relates to metallocenes of elements belonging to the subgroups of the periodic table in combination with a further photoinitiator having an activated halogene-containing group for use in photopolymerizable recording material. These initiator combinations, however, are very oxygen- and hydrolysis-sensitive and are therefore hardly suitable for the production of printing plates and photoresist materials.

It is also known to use a combination of special organometal compounds and onium salts in a hardening agent for polymerizable compositions (U.S. Pat. No. 5,086,086). In this connection, organometal compounds are used as metallocenes, whose essential feature is that they comprise at least one metal-metal-sigma-bond, i.e. that at least two transition metal atoms are present in a complex. The curing agents of U.S. Pat. No. 5,086,086 are not used in combination with dyes for light-induced polymerisation.

U.S. Pat. No. 4,971,892 discloses photopolymerizable compositions which are especially suitable for printing plates and which are supposed to show a high degree of sensitivity towards visible radiation. As an initiator system for the radical polymerisation, these photopolymerizable compositions comprise an initiator selected from diaryliodonium salts, halogenated triazines and triarylsulfonium salts as well as a specific merocyanine dye.

Even though progress has been made in increasing the visible radiation sensitivity of photopolymerizable compositions, there is still a demand for compositions with further improved properties, in particular with an increased photosensitivity.

SUMMARY OF THE INVENTION

It is therefore an object of the invention to provide novel photopolymerizable compositions which show improved properties compared to the compositions known in the prior art, in particular an improved photosensitivity, and which are suitable for the production of printing plates with a high impression performance and of photoresists with a high degree of resistance against processing fluids in a cured state, which consist of a simple and thus economical composition and which have favorable thermal storage stability.

This object is achieved by a visible radiation sensitive composition which comprises as main components a) a binder, b) one or more polymerizable compounds containing at least one polymerizable group, c) one or more dyes having an absorption in the range of about 250 nm to about 700 nm, d) at least one metallocene, the central atom of which is a metal atom taken from the fourth subgroup of the periodic table of the elements, and e) at least one onium compound.

The invention also relates to a visible radiation sensitive recording material, wherein the visible radiation sensitive composition according to the present invention is applied to a carrier.

DETAILED DESCRIPTION OF THE INVENTION

The binders to be used are not restricted in any way and can be selected by the person skilled in the art in the known manner for the individual applications. Water-insoluble oligomers and polymers which are soluble in aqueous-alkaline media as disclosed in DE-A-40 08 815 are preferred. Especially preferred are binders comprising carboxyl groups, e.g. copolymers of (meth)acrylic acid and/or unsaturated homologues thereof such as crotonic acid, copolymers of maleic acid anhydride or the semi-esters thereof, products of the reaction of hydroxy group-containing polymers and dicarboxylic acid anhydrides, and mixtures thereof.

Polymerizable compounds, which can be used for the visible radiation sensitive compositions according to the invention are also known in the prior art and can be selected by the person skilled in the art for the desired application of the visible radiation sensitive compositions according to the present invention based on his general knowledge. Polymerizable compounds suitable for the purpose of the present invention are described e.g. in EP-A-445 624, U.S. Pat. No. 2,760,863 and U.S. Pat No. 3,060,023. In particular the document EP-A-445 624 offers a helpful listing of polymerizable compounds which can be used in the visible radiation sensitive compositions of the present invention (cf. e.g. page 4, line 17 to page 7, line 14).

Most preferred are polymerizable compounds containing radically polymerizable olefinic double bonds.

The dyes which can be used in the compositions according to the invention are dyes known in this technical field which are also mentioned in EP-A-445 624. Suitable dyes are therefore in particular xanthene, benzoxanthene, benzothioxanthene, thiazine, pyronine, porphyrin or acridine dyes. Suitable xanthene and thiazine dyes are described for example in EP-A-287 817, suitable benzoxanthene and benzothioxanthene dyes are described in DE-A-20 25 291 and EP-A-321 828. A suitable porphyrin dye is e.g. hematoporphyrin and a suitable acridine dye is e.g. acriflavine chloride-hydrochloride. Examples of xanthene dyes are eosin B, eosin J, alcohol-soluble eosin, cyanosin, bengal rose, erythrosin, 2,3,7-trihydroxy-9-phenylxanthene-6-one and rhodamine-6 G. Examples of thiazine dyes are thionine, azure A and azure C. Examples of pyronine dyes are pyronine B and pyronin GY. Especially preferred are dyes of the type of triarylmethane, diarylmethane, xanthene, thioxanthene, thiazine, pyrazine, pyronine, aza[18]annulene, acridine or polymethine dyes.

The amount of the photoreducible dye is preferably in the range of 0.001 to 30 weight %, most preferably in the range of 0.01 to 20 weight %, based on the non-volatile parts of the composition.

In order to improve the sensitivity, the visible radiation sensitive composition according to the invention comprises an initiator system consisting of a metallocene which functions as a photoinitiator and an onium compound which functions as a coinitiator. Metallocenes especially suitable for the present invention are disclosed e.g. in EP-A-122 223 as being titanocenes. However, in addition to titanium as the central atom, the use of zirconium as the central atom of the metallocene is particularly preferred in the composition of the present invention.

Metallocenes which can be used in the composition according to the present invention are either commercially available, such as e.g. bis(cyclopentadienyl)-bis-[2,6-difluoro-3-(pyrr-1-yl)-phenyl]-titanium (CGI 784 of the company Ciba-Geigy), which represents an especially preferred compound for the composition of the present invention, or can be prepared according to the methods described in the prior art, e.g. in EP-A-122 223. Further metallocenes which are known photoinitiators are for example described in U.S. Pat. No. 3,717,558, U.S. Pat. No. 4,590,287 and U.S. Pat. No. 5,106,722. Metallocenes of elements of subgroup IV of the periodic table, in particular compounds containing titanium and zirconium are, in addition to EP-A-122 223, also described in numerous further documents, as e.g. EP-A-119 162, EP-A-186 626, EP-A-242 330, EP-A-255 486, EP-A-256 981 and EP-A-269 573.

Especially preferred are metallocenes having a titanium or zirconium atom as the central atom and additionally having four aromatic ligands. More preferred are metallocenes wherein two ligands represent optionally substituted cyclopentadienyl groups and two ligands represent substituted phenyl groups. Most preferred is a metallocene wherein the substituted phenyl groups contain halogen atoms. Phenyl groups are also preferred which contain at least one fluorine in the o-position and which can furthermore be substituted by halogen atoms, alkyl or alkoxy groups with 1 to 4 carbon atoms and/or an optionally etherified or esterified polyoxyalkylene group. The polyoxyalkylene group generally has 1 to 6 oxyalkylene units.

Suitable onium salts are mentioned for example in U.S. Pat. No. 5,086,086. Out of the possible onium salts mentioned therein iodonium, sulfonium, and phosphonium salts, and N-substituted N-heterocyclic onium salts or diazonium salts are preferred. Especially preferred are a diaryliodonium salt or an N-alkoxypyridinium salt. The selection of the counterion of the onium salt is not very critical. The following is a list of examples of special onium salts: 4,4'-dicumyliodonium chloride, N-methoxy-α-picolinium-p-toluene sulfonate, 4-methoxybenzene-diazonium-tetrafluoro borate, 4,4'-bis-dodecylphenyliodonium-hexafluoro phosphate, 2-cyanoethyl-triphenylphosphonium chloride and bis-[4-diphenylsulfoniophenyl]sulfide-bis-hexafluoro phosphate (Degacure ® KI85 of the company Degussa).

Preferably, the composition contains a) about 5 to 90% by weight of a binder, b) about 5 to 90% by weight of polymerizable compounds, c) about 0.01 to 20% by weight of dyes, d) about 0.05 to 20% by weight of metallocene compounds, and e) about 0.05 to 20% by weight of an onium compound.

The visible radiation sensitive compositions of the present invention can be produced by means of methods known in the prior art and can then be processed further.

The compositions according to the invention are especially suitable as recording material in the production of planographic printing plates and in the field of photoresist technology. For this purpose, e.g. aluminum, steel, zinc, and copper foils, as well as plastic sheets made for example of polyethyleneterephthalate or cellulose acetate and screen printing substrates such as Perlon gauze can be used as substrates for the recording material of the present invention. In many cases, it is advantageous to subject the surface of the substrate to a mechanical or chemical pre-treatment which allows an adjustment of the adhesive properties of the layer, an improvement of the lithographical properties of the substrate surface or a decrease in the reflexion property of the substrate in the actinic range of the copy layer (antihalation).

The production of the visible radiation sensitive compositions is carried out by means of generally known methods, e.g. as described in EP-A-445 624. In this process, the layer components are taken up in a solvent and the solution or dispersion is applied to the selected substrate by means of pouring, spraying, immersing, with the help of rolls, etc. and is then dried. The selection of the light sources is not particularly restricted, for example, use can be made of tubular lamps, xenon pulse lamps, metal halogenide doped high-pressure mercury vapor lamp and carbon arc lamps. It is also possible to carry out the exposure by means of common projection or magnifying apparatuses under the light of a metal filament lamp or contact exposure by means of common light bulbs. The visible radiation sensitive compositions of the present invention and the recording materials containing the same are especially suitable for laser exposure, for example by means of argon ion, krypton ion, dye, helium, cadmium, or helium-neon lasers. It is part of the knowledge of the person skilled in the art how to carry out laser exposure.

Preferably, the visible radiation sensitive composition and thus the photopolymerizable layer is protected by a translucent and oxygen-impermeable layer which is soluble in the developer. Suitable layers consist for example of polyvinyl alcohol, polyvinylpyrrolidone, gelatin and the like. The thickness of these protection layers generally ranges from 0.1 to 10 μm, preferably from 0.2 to 5 μm.

It is, however, also possible to use an unsupported cover film which is removed prior to the developing of the copy layer. For this purpose for example polyester films are suitable.

The photosensitivity of the layer can be increased by briefly heating the layer to 60 to 180° C. prior to the aqueous alkaline developing step. The heating is carried out after exposure and increases the crosslinking of the layer.

EXAMPLES

The developing step can be carried out by means of organic solvents, however, preferably by means of a slightly alkaline aqueous solution. During the developing step the unexposed parts of the layer are removed and the exposed regions of the copy layer remain on the carrier. Aqueous developer solutions can comprise a small part of solvents which are miscible with water. It can also comprise further known additives such as wetting agents, dyes or salts.

The examples further illustrate the invention. All the given parts represent parts by weight. All experiments were carried out under red light.

Example 1

Electrochemically roughenend and anodically oxidized aluminum was used as the base material for the printing plates. The thickness of the oxide layer is 3.2 g/m². The oxide layer was treated with an aqueous solution of polyvinylphosphonic acid. The thus produced base material was coated with a solution of the following composition by means of a knife coater:

| | |
|---|---|
| 4.83 parts | of a terpolymer, obtained by polymerisation of 476 parts styrene, 476 parts methyl methacrylate and 106 parts methacrylic acid |
| 1.22 parts | dipentaerythrol pentaacrylate |
| 7.44 parts | of an 80% methylethylketone solution of an urethane acrylate obtained by reacting Desmodur ® N100 (of the company Bayer) and hydroxyethyl acrylate and pentaerythrol triacrylate with a double bond content of 0.5 double bonds per 100 g after completion of the reaction of the isocyanate groups |
| 1.94 parts | of the acrylic resin Ioncryl ® 683 of the company Johnson Polymer (acid number 150) |
| 0.1 parts | ethyleosin |
| 0.35 parts | 4,4'-dicumyliodonium chloride |
| 0.25 parts | bis(cyclopentadienyl)-bis-[2,6-difluoro-3-(pyrr-1-yl)-phenyl]titanium (CGI 784 of the company Ciba-Geigy) |
| 60 parts | methylethylketone |
| 52.5 parts | methyl glycol |
| 37.5 parts | methanol |

The plates were dried at 95° C. in a circulation drying cabinet for 5 minutes. The gravimetrically determined weight of the dried layer was 1.8 g/m². Subsequently, an oxygen-impermeable layer with a dried layer weight of 1.7 g/m² was analogously applied by coating with a solution of the following composition:

| | |
|---|---|
| 50 parts | polyvinyl alcohol (Airvol ® 203 of the company Air Products; 12% remaining acetyl groups) |
| 270 parts | water |

The drying was again carried out at a temperature of 95° C. for 5 minutes. The thus produced plates were exposed in a vacuum printing frame by means of 4 tungsten light bulbs (200 W each) at a distance of 90 cm. A 13-step grey wedge starting at a density of 0.15 and having an increment of 0.15 served as an exposure matrix. Immediately after exposure, the plates were heated to 95° C. for 1 minute in order to reinforce the terminated photopolymerisation. The plates were developed for 30 seconds in a developer of the following composition:

| | |
|---|---|
| 3.4 parts | Rewopol ® NLSS 28 (company REWO) |
| 1.8 parts | 2-phenoxyethanol |
| 1.1 parts | diethanol amine |
| 1.0 parts | Texapon ® 842 (company Henkel) |
| 0.6 parts | Nekal ® BX Paste (BASF) |
| 0.2 parts | 4-toluenesulfonic acid |
| 91.9 parts | water. |

Then the developer solution is again rubbed on the surface for 30 seconds by means of a tampon and then the entire plate is rinsed with water. After this treatment, the exposed parts remain on the plate. After blackening, the plate shows the wedge steps as listed in Table I. After developing and washing with water, in order to test the printing properties of the plate, it is rubbed with an aqueous solution of 0.5% phosphoric acid and 6% gum arabic. The thus produced plate was used to produce 100,000 copies on an arc offset printing machine under usual printing conditions. The quality was good and the plates could have been copied further.

Example 2

The substrate described in Example 1 was coated under the same conditions as in Example 1 with a layer of the following composition so that a layer weight of 1.75 g/cm² was obtained:

| | |
|---|---|
| 3.22 parts | of the terpolymer used in Example 1 consisting of styrene, methyl methacrylate and methacrylic acid |
| 0.81 parts | dipentaerythrol pentaacrylate |
| 4.96 parts | of an 80% methylethylketone solution of the urethane acrylate used in Example 1 |
| 1.29 parts | of the acrylic resin Ioncryl ® 683 of the company Johnson Polymer (acid number 150) |
| 0.097 parts | ethyleosin |
| 0.35 parts | N-methoxy-α-picolinium-p-toluenesulfonate |
| 0.25 parts | bis(cyclopentadienyl)-bis-[2,6-difluoro-3-(pyrr-1-yl)phenyl]titanium (CGI 784 of the company Ciba-Geigy) |
| 40 parts | methylethylketone |
| 35 parts | methyl glycol |
| 25 parts | methanol |

After the application of a polyvinylalcohol layer and developing the plate as described in Example 1, the wedge step number as shown in Table I was obtained. The printing results correspond to the ones of Example 1.

Example 3

The substrate described in Example 1 was coated under the same conditions as in Example 1 with a layer of the following composition so that a layer weight of 1.9 g/cm² was obtained:

| | | |
|---|---|---|
| 3.22 parts | of the terpolymer used in Example 1 consisting of styrene, methyl methacrylate and methacrylic acid | |
| 0.81 parts | dipentaerythrol pentaacrylate | |
| 4.96 parts | of an 80% methylethylketone solution of the urethane acrylate used in Example 1 | |
| 1.29 parts | of the acrylic resin Ioncryl ® 683 of the company Johnson Polymer (acid number 150) | |
| 0.097 parts | Rhodamine 6G | |
| 0.35 parts | N-methoxy-pyridinium-p-toluenesulfonate | |
| 0.25 parts | bis(cyclopentadienyl)-bis-[2,6-difluoro-3-(pyrr-1-yl)-phenyl]titanium (CGI 784 of the company Ciba-Geigy) | |
| 40 parts | methylethylketone | |
| 35 parts | methyl glycol | |
| 25 parts | methanol | |

After the application of a polyvinylalcohol layer and developing the plate as described in Example 1, the wedge step number as shown in Table I was obtained. The printing results correspond to the ones of Example 1.

Example 4

The substrate described in Example 1 was coated under the same conditions as in Example 1 with a layer of the following composition so that a layer weight of 1.7 g/cm² was obtained:

| | | |
|---|---|---|
| 6.05 parts | of the terpolymer used in Example 1 consisting of styrene, methyl methacrylate and methacrylic acid | |
| 1.52 parts | dipentaerythrol pentaacrylate | |
| 9.32 parts | of an 80% methylethylketone solution of the urethane acrylate used in Example 1 | |
| 2.4 parts | of the acrylic resin Ioncryl ® 683 of the company Johnson Polymer (acid number 150) | |
| 0.18 parts | ethyleosin | |
| 0.66 parts | 4-methoxbenzenediazonium-tetrafluoro borate | |
| 0.47 parts | bis(cyclopentadienyl)-bis-[2,6-difluoro-3-(pyrr-1-yl)-phenyl]titanium (CGI 784 of the company Ciba-Geigy) | |
| 75 parts | methylethylketone | |
| 66 parts | methyl glycol | |
| 47 parts | methanol | |

After the application of a polyvinylalcohol layer and developing the plate as described in Example 1, the wedge step number as shown in Table I was obtained. The printing results correspond to the ones of Example 1.

Example 5

The substrate described in Example 1 was coated under the same conditions as in Example 1 with a layer of the following composition so that a layer weight of 1.85 g/cm² was obtained:

| | |
|---|---|
| 3.02 parts | of the terpolymer used in Example 1 consisting of styrene, methyl methacrylate and methacrylic acid |
| 0.75 parts | dipentaerythrol pentaacrylate |
| 4.65 parts | of an 80% methylethylketone solution of the urethane acrylate used in Example 1 |
| 1.2 parts | of the acrylic resin Ioncryl ® 683 of the company Johnson Polymer (acid number 150) |
| 0.09 parts | ethyleosin |
| 0.45 parts | 4,4'-bis-dodecylphenyliodonium-hexafluorophosphate |
| 0.25 parts | bis(cyclopentadienyl)-bis-[2,6-difluoro-3-(pyrr-1-yl)-phenyl]titanium (CGI 784 of the company Ciba-Geigy) |
| 38 parts | methylethylketone |
| 33 parts | methyl glycol |
| 24 parts | methanol |

After the application of a polyvinylalcohol layer and developing the plate as described in Example 1, the wedge step number as shown in Table I was obtained. The printing results correspond to the ones of Example 1.

Example 6

The substrate described in Example 1 was coated under the same conditions as in Example 1 with a layer of the following composition so that a layer weight of 1.8 g/cm² was obtained:

| | |
|---|---|
| 4.83 parts | of the terpolymer used in Example 1 consisting of styrene, methyl methacrylate and methacrylic acid |
| 1.22 parts | dipentaerythrol pentaacrylate |
| 7.44 parts | of an 80% methylethylketone solution of the urethane acrylate used in Example 1 |
| 1.94 parts | of the acrylic resin Ioncryl ® 683 of the company Johnson Polymer (acid number 150) |
| 0.1 parts | Rhodamine 6G |
| 0.45 parts | 2-cyanoethyl-triphenylphosphonium chloride |
| 0.25 parts | bis(cyclopentadienyl)-bis-[2,6-difluoro-3-(pyrr-1-yl)-phenyl]titanium (CGI 784 of the company Ciba-Geigy) |
| 60 parts | methylethylketone |
| 52.5 parts | methyl glycol |
| 37.5 parts | methanol |

After the application of a polyvinylalcohol layer and developing the plate as described in Example 1, the wedge step number as shown in Table I was obtained. The printing results correspond to the ones of Example 1.

Example 7

The substrate described in Example 1 was coated under the same conditions as in Example 1 with a layer of the following composition so that a layer weight of 1.9 g/cm² was obtained:

| | |
|---|---|
| 4.83 parts | terpolymer 1 consisting of 10 parts styrene, 60 parts n-hexyl methacrylate and 30 parts methacrylic acid |
| 1.22 parts | dipentaerythrol pentaacrylate |
| 7.44 parts | of an 80% methylethylketone solution of the urethane acrylate used in Example 1 |
| 1.94 parts | of the acrylic resin Ioncryl ® 683 of the company Johnson Polymer (acid number 150) |
| 0.1 parts | Rhodamine B |
| 0.45 parts | 4,4'-bis-dodecylphenyliodonium-hexafluorophosphate |
| 0.25 parts | dicyclopentadienyl-bis-pentafluorophenyl-zirconium |
| 60 parts | methylethylketone |
| 52.5 parts | methyl glycol |
| 37.5 parts | methanol |

After the application of a polyvinylalcohol layer and developing the plate as described in Example 1, the wedge step number as shown in Table I was obtained. The printing results correspond to the ones of Example 1.

Example 8

The substrate described in Example 1 was coated under the same conditions as in Example 1 with a layer of the following composition so that a layer weight of 1.9 g/cm² was obtained:

| | |
|---|---|
| 3.05 parts | methyl methacrylate copolymer Elvacite ® 2670 (of the company DuPont, acid number = 74) |
| 0.81 parts | dimethyloipropane tetraacrylate |
| 4.96 parts | hexa-functional urethane acrylate Actilane ® 110 (of the company Akcros Chemicals) |
| 1.29 parts | of the acrylic resin Ioncryl ® 683 of the company Johnson Polymer (acid number 150) |
| 0.12 parts | methyleosin |
| 0.35 parts | bis[4-diphenylsulfonio)phenyl]sulfide-bis-hexa-fluoro phosphate (Degacure ® K185, of the company Degussa) |
| 0.22 parts | bis(cyclopentadienyl)-bis-(pentafluorophenyl)-titanium |
| 60 parts | methylethylketone |
| 52.5 parts | methyl glycol |
| 37.5 parts | methanol |

After the application of a polyvinylalcohol layer and developing the plate as described in Example 1, the wedge step number as shown in Table I was obtained. The printing results correspond to the ones of Example 1.

Example 9

Comparative Example

The substrate described in Example 1 was coated under the same conditions as in Example 1 with a layer of the following composition so that a layer weight of 1.8 g/cm² was obtained:

| | |
|---|---|
| 4.83 parts | of the terpolymer used in Example 1, consisting of styrene, methyl methacrylate and methacrylic acid |
| 1.22 parts | dipentaerythrol pentaacrylate |
| 7.44 parts | of an 80% methylethylketone solution of the urethane acrylate used in Example 1 |
| 1.94 parts | of the acrylic resin Ioncryl ® 683 of the company Johnson Polymer (acid number 150) |
| 0.1 parts | ethyleosin |
| 0.45 parts | 2-(4-methoxynaphth-1-yl)-4,6-bis-(trichloromethyl)-s-triazine |
| 0.25 parts | bis(cyclopentadienyl)-bis-[2,6-difluoro-3-pyrr-1-yl)-phenyl]titanium (CGI 784 of the company Ciba-Geigy) |
| 60 parts | methylethylketone |
| 52.5 parts | methyl glycol |
| 37.5 parts | methanol |

This composition corresponds to a composition of the prior art as disclosed in DE-A-38 32 032.

After the application of a polyvinylalcohol layer and developing the plate as described in Example 1, the wedge step number as shown in Table I was obtained. The number of printing operations was 90,000.

Example 10

Comparative Example

The substrate described in Example 1 was coated under the same conditions as in Example 1 with a layer of the following composition so that a layer weight of 1.8 g/cm² was obtained:

| | |
|---|---|
| 4.83 parts | of the terpolymer used in Example 1, consisting of styrene, methyl methacrylate and methacrylic acid |
| 1.22 parts | dipentaerythrol pentaacrylate |
| 7.44 parts | of an 80% methylethylketone solution of the urethane acrylate used in Example 1 |
| 1.94 parts | of the acrylic resin Ioncryl ® 683 of the company Johnson Polymer (acid number 150) |
| 0.1 parts | ethyleosin |
| 0.45 parts | 2,4-bis-trichloromethyl-6-(4-styrylphenyl)-s-triazine |
| 0.25 parts | bis(cyclopentadienyl)-bis-[2,6-difluoro-3-(pyrr-1-yl)phenyl]titanium (CGI 784 of the company Ciba-Geigy) |
| 60 parts | methylethylketone |
| 52.5 parts | methyl glycol |
| 37.5 parts | methanol |

This composition corresponds to a composition of the prior art as disclosed in DE-A-38 32 032.

After the application of a polyvinylalcohol layer and developing the plate as described in Example 1, the wedge step number as shown in Table I was obtained. The number of printing operations was 90,000.

Example 11

Comparative Example

The substrate described in Example 1 was coated under the same conditions as in Example 1 with a layer of the following composition so that a layer weight of 1.8 g/cm² was obtained:

| | |
|---|---|
| 3.22 parts | of the terpolymer used in Example 1, consisting of styrene, methyl methacrylate and methacrylic acid |
| 0.81 parts | dipentaerythrol pentaacrylate |
| 4.96 parts | of an 80% methylethylketone solution of the urethane acrylate used in Example 1 |
| 1.3 parts | of the acrylic resin Ioncryl ® 683 of the company Johnson Polymer (acid number 150) |
| 0.97 parts | ethyleosin |
| 0.20 parts | bis(cyclopentadienyl)-bis-[2,6-difluoro-3-(pyrr-1-yl)phenyl]titanium (CGI 784 of the company Ciba-Geigy) |
| 40 parts | methylethylketone |
| 35 parts | methyl glycol |
| 25 parts | methanol |

This composition corresponds to a composition of the prior art as disclosed in U.S. Pat. No. 5,106,722.

After the application of a polyvinylalcohol layer and developing the plate as described in Example 1, the wedge step number as shown in Table I was obtained. The printing results correspond to the ones of Example 1.

Example 12

Comparative Example

The substrate described in Example 1 was coated under the same conditions as in Example 1 with a layer of the following composition so that a layer weight of 1.75 g/cm² was obtained:

| | | |
|---|---|---|
| 3.22 parts | of the terpolymer used in Example 1 consisting of styrene, methyl methacrylate and methacrylic acid | |
| 0.81 parts | dipentaerythrol pentaacrylate | |
| 4.96 parts | of an 80% methylethylketone solution of the urethane acrylate used in Example 1 | |
| 1.3 parts | of the acrylic resin Ioncryl ® 683 of the company Johnson Polymer (acid number 150) | |
| 0.33 parts | 4,4'-dicumyliodonium chloride | |
| 0.97 parts | ethyleosin | |
| 40 parts | methylethylketone | |
| 35 parts | methyl glycol | |
| 25 parts | methanol | |

This composition essentially corresponds to a composition of the prior art as disclosed in U.S. Pat No. 4,971,892.

After the application of a polyvinylalcohol layer and developing the plate as described in Example 1, the wedge step number as shown in Table I was obtained. The printing results correspond to the ones of Example 1.

Example 13

Comparative Example

The substrate described in Example 1 was coated under the same conditions as in Example 1 with a layer of the following composition so that a layer weight of 1.85 g/cm² was obtained:

| | |
|---|---|
| 3.22 parts | of the terpolymer used in Example 1, consisting of styrene, methyl methacrylate and methacrylic acid |
| 0.81 parts | dipentaerythrol pentaacrylate |
| 4.96 parts | of an 80% methylethylketone solution of the urethane acrylate used in Example 1 |
| 1.29 parts | of the acrylic resin Ioncryl ® 683 of the company Johnson Polymer (acid number 150) |
| 0.35 parts | 4,4'-dicumyliodonium chloride |
| 0.25 parts | bis(cyclopentadienyl)-bis-[2,6-difluoro-3-(pyrr-1-yl)phenyl]titanium (CGI 784 of the company Ciba-Geigy) |
| 40 parts | methylethylketone |
| 35 parts | methyl glycol |
| 25 parts | methanol |

This composition essentially corresponds to a composition of the prior art as disclosed for example in U.S. Pat. No. 5,086,086 or U.S. Pat. No. 5,147,900, however, instead of the organometal compounds used in these documents, with which a production of printing plates was unsuccessful, a metallocene according to the present invention was used.

After the application of a polyvinylalcohol layer and developing the plate as described in Example 1, the wedge step number as shown in Table I was obtained. The printing results correspond to the ones of Example 1.

TABLE I

| Example No. | Exposure (seconds) | Number of wedge steps obtained |
|---|---|---|
| 1 | 30 | 6 |
| 2 | 40 | 5 |
| 3 | 30 | 4 |
| 4 | 40 | 5 |
| 5 | 30 | 6 |
| 6 | 50 | 5 |
| 7 | 40 | 3 |
| 8 | 40 | 4 |
| 9 (Comp. Example) | 40 | 3 |
| 10 (Comp. Example) | 120 | 2 |
| 11 (Comp. Example) | 120 | 4 |
| 12 (Comp. Example) | 240 | 4 |
| 13 (Comp. Example) | 120 | 4 |

We claim:

1. A radiation sensitive composition comprising:
   (a) at least one binder;
   (b) one or more polymerizable compounds, the polymerizable compounds containing radically polymerizable olefinic double bonds;
   (c) one or more dyes having an absorption in the range of about 250 nm to about 700 nm;
   (d) at least one metallocene selected from the group consisting of bis(cyclopentadienyl)-bis-{2,6-difluoro-3-(pyrr-1-yl)-phenyl}-titanium and bis(cyclopentadienyl)-bis-(pentafluorophenyl)-titanium; and
   (e) at least one onium salt;
   in which the composition is sensitive to visible radiation.

2. The composition of claim 1 in which:
   the one or more dyes are selected from the group consisting of triarylmethane, diarylmethane, xanthene, thioxanthene, thiazine, pyronine, pyrazine, aza{18}annulene, acridine and polymethine dyes; and
   the onium salt is a diaryliodonium salt or a N-alkoxypyridinium salt.

3. The composition of claim 1 in which the onium salt is a diaryliodonium salt or a N-alkoxypyridinium salt.

4. The composition of claim 1 in which the onium salt is selected from the group consisting of iodonium salts, sulfonium salts, phosphonium salts, N-substituted N-heterocyclic onium salts, and diazonium salts.

5. The composition of claim 4 in which the one or more dyes are selected from the group consisting of triarylmethane, diarylmethane, xanthene, thioxanthene, thiazine, pyronine, pyrazine, aza{18}annulene, acridine and polymethine dyes.

6. A radiation sensitive composition comprising:
   (a) at least one binder;
   (b) one or more polymerizable compounds, the polymerizable compounds containing radically polymerizable olefinic double bonds;
   (c) one or more dyes having an absorption in the range of about 250 nm to about 700 nm;
   (d) at least one metallocene, the central atom of which is a metal atom selected from the group consisting of titanium and zirconium; and
   (e) at least one onium salt selected from the group consisting of N-alkoxypyridinium salts, phosphonium salts, N-substituted-heterocyclic onium salts and diazonium salts;
   in which the composition is sensitive to visible radiation.

7. The composition of claim 6 in which the central metal atoms is titanium and the metallocene complex comprises two ligands that are optionally substituted cyclopentadienyl groups and two ligands that are phenyl groups substituted with at least one halogen atom.

8. The composition of claim 7 in which the metallocene is selected from the group consisting of bis (cyclopentadienyl)-bis-{2,6-difluoro-3-(pyrr-1-yl)-phenyl}-titanium and bis(cyclopentadienyl)-bis-(pentafluorophenyl)-titanium.

9. The composition of claim 8 in which the onium salt is an N-alkoxypyridinium salt.

10. The composition of claim 9 in which the one or more dyes are selected from the group consisting of triarylmethane, diarylmethane, xanthene, thioxanthene, thiazine, pyronine, pyrazine, aza{18}annulene, acridine and polymethine dyes.

* * * * *